United States Patent
Han et al.

(10) Patent No.: US 8,110,086 B2
(45) Date of Patent: Feb. 7, 2012

(54) METHOD OF MANUFACTURING A PROCESS CHAMBER COMPONENT HAVING YTTRIUM-ALUMINUM COATING

(75) Inventors: Nianci Han, San Jose, CA (US); Li Xu, San Jose, CA (US); Hong Shih, Walnut, CA (US)

(73) Assignee: Applied Materials, Inc., Santa Clara, CA (US)

( * ) Notice: Subject to any disclaimer, the term of this patent is extended or adjusted under 35 U.S.C. 154(b) by 112 days.

(21) Appl. No.: 11/982,039

(22) Filed: Oct. 31, 2007

(65) Prior Publication Data

US 2008/0110760 A1    May 15, 2008

Related U.S. Application Data

(60) Division of application No. 10/824,123, filed on Apr. 13, 2004, now Pat. No. 7,371,467, which is a continuation-in-part of application No. 10/042,666, filed on Jan. 8, 2002, now Pat. No. 6,942,929.

(51) Int. Cl.
   *C25D 11/04* (2006.01)
(52) U.S. Cl. .................................. 205/213; 205/325
(58) Field of Classification Search ............ 205/325, 205/213
   See application file for complete search history.

(56) References Cited

U.S. PATENT DOCUMENTS

| | | | |
|---|---|---|---|
| 3,665,260 A * | 5/1972 | Kirkpatrick et al. ........ | 361/529 |
| 3,754,903 A | 8/1973 | Goward et al. | |
| 4,244,743 A | 1/1981 | Blackburn et al. | |
| 4,433,004 A | 2/1984 | Yonezawa et al. | |
| 4,743,493 A | 5/1988 | Sioshansi et al. | |
| 4,777,090 A | 10/1988 | Ovshinsky et al. | |
| 4,861,737 A | 8/1989 | Prudhomme van Reine | |
| 4,888,820 A | 12/1989 | Chen et al. | |
| 4,897,315 A | 1/1990 | Gupta | |
| 4,910,092 A | 3/1990 | Olson et al. | |
| 4,933,239 A | 6/1990 | Olson et al. | |
| 4,939,308 A | 7/1990 | Maxfield et al. | |
| 4,973,445 A | 11/1990 | Singheiser et al. | |
| 5,162,295 A | 11/1992 | Behi et al. | |
| 5,205,051 A | 4/1993 | Hurwitt | |
| 5,244,875 A | 9/1993 | Hauser et al. | |
| 5,272,120 A | 12/1993 | Kosuda et al. | |
| 5,320,719 A | 6/1994 | Lasbmore et al. | |
| 5,366,585 A | 11/1994 | Robertson et al. | |
| 5,445,776 A | 8/1995 | Honma et al. | |

(Continued)

FOREIGN PATENT DOCUMENTS

DE        3543802        6/1987

(Continued)

OTHER PUBLICATIONS

Hawley's Condensed Chemical Dictionary, 14th Edition, John Wiley & Sons,. Inc., 2002, "anodic coating".*

(Continued)

*Primary Examiner* — Alexa Neckel
*Assistant Examiner* — William Leader
(74) *Attorney, Agent, or Firm* — Janah & Associates, P.C.; Ashok K. Janah

(57) ABSTRACT

A method of manufacturing a substrate processing chamber component comprises forming a chamber component comprising a metal alloy comprising yttrium and aluminum, and anodizing an exposed surface of the metal alloy.

23 Claims, 7 Drawing Sheets

U.S. PATENT DOCUMENTS

| | | | |
|---|---|---|---|
| 5,455,119 A | 10/1995 | Taylor et al. | |
| 5,458,700 A * | 10/1995 | Masumoto et al. | 148/403 |
| 5,470,820 A | 11/1995 | Hauser et al. | |
| 5,476,837 A | 12/1995 | Bharacharya et al. | |
| 5,494,713 A | 2/1996 | Ootuki | |
| 5,498,313 A | 3/1996 | Bailey et al. | |
| 5,534,309 A | 7/1996 | Liu | |
| 5,624,632 A | 4/1997 | Baumann et al. | |
| 5,643,394 A | 7/1997 | Maydan et al. | |
| 5,676,205 A | 10/1997 | White | |
| 5,680,013 A | 10/1997 | Dornfest et al. | |
| 5,746,875 A | 5/1998 | Maydan et al. | |
| 5,753,044 A | 5/1998 | Hanawa et al. | |
| 5,798,016 A | 8/1998 | Oehrlein et al. | |
| 5,807,613 A | 9/1998 | Aguero et al. | |
| 5,824,205 A | 10/1998 | Foster | |
| 5,829,939 A | 11/1998 | Iwai et al. | |
| 5,833,829 A | 11/1998 | Foster | |
| 5,842,491 A | 12/1998 | Han et al. | |
| 5,880,031 A | 3/1999 | Wong | |
| 5,885,360 A | 3/1999 | Han et al. | |
| 5,887,605 A | 3/1999 | Lee et al. | |
| 5,901,716 A | 5/1999 | Hwang et al. | |
| 5,948,513 A | 9/1999 | Turnbull et al. | |
| 5,964,928 A | 10/1999 | Tomlinson et al. | |
| 5,964,952 A | 10/1999 | Kunze-Concewitz | |
| 6,004,631 A | 12/1999 | Mori | |
| 6,095,084 A | 8/2000 | Shamouilian et al. | |
| 6,120,606 A | 9/2000 | Peng | |
| 6,123,791 A | 9/2000 | Han et al. | |
| 6,129,100 A | 10/2000 | Kitagawa et al. | |
| 6,158,445 A | 12/2000 | Olesen et al. | |
| 6,179,976 B1 | 1/2001 | D'Souza et al. | |
| 6,183,888 B1 | 2/2001 | Alperine et al. | |
| 6,197,150 B1 | 3/2001 | Kwag et al. | |
| 6,231,808 B1 | 5/2001 | Hashikura et al. | |
| 6,257,366 B1 | 7/2001 | Gerretsen et al. | |
| 6,273,108 B1 | 8/2001 | Bergman et al. | |
| 6,287,644 B1 | 9/2001 | Jackson et al. | |
| 6,306,276 B1 | 10/2001 | Nobe et al. | |
| 6,306,489 B1 | 10/2001 | Hellmann et al. | |
| 6,352,611 B1 | 3/2002 | Han et al. | |
| 6,365,010 B1 | 4/2002 | Hollars | |
| 6,379,575 B1 | 4/2002 | Yin et al. | |
| 6,383,964 B1 | 5/2002 | Nakahara et al. | |
| 6,404,615 B1 * | 6/2002 | Wijeyesekera et al. | 361/306.1 |
| 6,405,423 B1 * | 6/2002 | Donde | 29/428 |
| 6,410,471 B2 * | 6/2002 | Kaneyoshi | 501/152 |
| 6,447,937 B1 | 9/2002 | Murakawa et al. | |
| 6,509,070 B1 | 1/2003 | Voevodin et al. | |
| 6,517,303 B1 | 2/2003 | White et al. | |
| 6,593,235 B2 * | 7/2003 | Uochi et al. | 438/673 |
| 6,620,520 B2 | 9/2003 | O'Donnell et al. | |
| 6,623,595 B1 | 9/2003 | Han et al. | |
| 6,641,697 B2 | 11/2003 | Han et al. | |
| 6,645,585 B2 | 11/2003 | Ozono | |
| 6,776,873 B1 | 8/2004 | Sun et al. | |
| 6,780,526 B2 * | 8/2004 | Payne et al. | 428/627 |
| 6,783,863 B2 | 8/2004 | Harada et al. | |
| 6,789,498 B2 | 9/2004 | Kaushal et al. | |
| 6,942,929 B2 | 9/2005 | Han et al. | |
| 6,983,892 B2 | 1/2006 | Noorbakhsh et al. | |
| 7,086,918 B2 | 8/2006 | Hsiao et al. | |
| 7,131,883 B2 | 11/2006 | Park et al. | |
| 7,371,467 B2 | 5/2008 | Han et al. | |
| 7,446,474 B2 | 11/2008 | Maldonado et al. | |
| 7,479,304 B2 | 1/2009 | Sun et al. | |
| 7,479,464 B2 | 1/2009 | Sun et al. | |
| 7,618,769 B2 | 11/2009 | Brueckner et al. | |
| 7,645,710 B2 | 1/2010 | Olsen et al. | |
| 2001/0003271 A1 | 6/2001 | Otsuki | |
| 2002/0009560 A1 | 1/2002 | Ozono | |
| 2002/0012791 A1 | 1/2002 | Morita et al. | |
| 2002/0086118 A1 | 7/2002 | Chang et al. | |
| 2002/0086153 A1 | 7/2002 | O'Donnell et al. | |
| 2002/0100554 A1 | 8/2002 | Han et al. | |
| 2003/0029563 A1 | 2/2003 | Kaushal et al. | |
| 2003/0127049 A1 | 7/2003 | Han et al. | |
| 2003/0159657 A1 | 8/2003 | Kaushal et al. | |
| 2004/0002221 A1 | 1/2004 | O'Donnell et al. | |
| 2004/0191545 A1 | 9/2004 | Han et al. | |
| 2005/0227118 A1 | 10/2005 | Uchimaru et al. | |
| 2005/0271984 A1 | 12/2005 | Brueckner et al. | |
| 2006/0055321 A1 | 3/2006 | Maldonado et al. | |
| 2007/0079936 A1 | 4/2007 | Li et al. | |
| 2007/0134416 A1 | 6/2007 | Wang et al. | |
| 2007/0151581 A1 | 7/2007 | Wang et al. | |
| 2007/0209930 A1 | 9/2007 | Chua et al. | |
| 2007/0212896 A1 | 9/2007 | Olsen et al. | |
| 2007/0218623 A1 | 9/2007 | Chua et al. | |
| 2008/0003151 A1 | 1/2008 | Raoux et al. | |
| 2008/0017516 A1 | 1/2008 | Han et al. | |
| 2008/0110760 A1 | 5/2008 | Han et al. | |
| 2008/0213496 A1 | 9/2008 | Sun et al. | |
| 2008/0223725 A1 | 9/2008 | Han et al. | |
| 2008/0264564 A1 | 10/2008 | Sun et al. | |
| 2008/0264565 A1 | 10/2008 | Sun et al. | |
| 2009/0025751 A1 | 1/2009 | Wang et al. | |
| 2009/0036292 A1 | 2/2009 | Sun et al. | |
| 2009/0068433 A1 | 3/2009 | Rasheed | |
| 2009/0072009 A1 | 3/2009 | Crockett et al. | |
| 2009/0110807 A1 | 4/2009 | Koenig | |
| 2009/0162647 A1 * | 6/2009 | Sun et al. | 428/336 |
| 2009/0214825 A1 | 8/2009 | Sun et al. | |
| 2009/0277874 A1 | 11/2009 | Rui et al. | |
| 2009/0302002 A1 | 12/2009 | Collins et al. | |

FOREIGN PATENT DOCUMENTS

| | | |
|---|---|---|
| DE | 9421671 | 8/1996 |
| EP | 0268721 | 6/1988 |
| EP | 0413282 | 2/1992 |
| EP | 0849767 | 6/1998 |
| EP | 0997546 | 5/2000 |
| JO | 11-157916 | 6/1999 |
| JP | 59-205468 | 11/1984 |
| JP | 62-174377 | 7/1987 |
| JP | 63-216943 | 9/1988 |
| JP | 02-159344 | 6/1990 |
| JP | 04-333573 | 11/1992 |
| JP | 06-236913 | 8/1994 |
| JP | 62-036913 | 8/1994 |
| JP | 06-310065 | 11/1994 |
| JP | 06-310363 | 11/1994 |
| JP | 10-045461 | 2/1998 |
| JP | 10-045467 | 2/1998 |
| JP | 10-067554 | 3/1998 |
| JP | 62-174377 | 7/1998 |
| JP | 10-209354 | 8/1998 |
| JP | 10-067554 | 10/1998 |
| JP | 11-029378 | 2/1999 |
| JP | 11-157916 | 6/1999 |
| JP | 11-229142 | 8/1999 |
| JP | 01-1335804 | 12/1999 |
| JP | 11-335804 | 12/1999 |
| JP | 2000-096176 | 4/2000 |
| JP | 01-059572 | 6/2000 |
| JP | 2000-159572 | 6/2000 |
| JP | 2000-164572 | 6/2000 |
| JP | 01-091369 | 7/2000 |
| JP | 2000-191369 | 7/2000 |
| JP | 03-013656 | 11/2000 |
| JP | 03-027424 | 11/2000 |
| JP | 2000-313656 | 11/2000 |
| JP | 2000-327424 | 11/2000 |
| JP | 2001-164354 | 6/2001 |
| KR | 20-0375080-0000 | 1/2005 |
| TW | 557642 | 10/2003 |
| WO | WO 97/16133 | 1/1998 |
| WO | WO 98/14980 | 4/1998 |
| WO | WO 98/50599 | 11/1998 |
| WO | WO-009354 | 4/1999 |
| WO | WO 99/20812 | 4/1999 |
| WO | WO 99/16282 | 7/1999 |
| WO | PCT/US99/16282 | 11/1999 |
| WO | WO 00/07216 | 2/2000 |
| WO | WO-00/07216 | 2/2000 |
| WO | WO-02/20864 | 3/2002 |

| | | |
|---|---|---|
| WO | WO-02/057506 | 7/2002 |
| WO | WO 02/057506 | 7/2002 |
| WO | WO 02/041150 | 12/2002 |
| WO | WO-03/001559 | 1/2003 |
| WO | WO-03/060187 | 7/2003 |
| WO | WO 03/060187 | 7/2003 |
| WO | WO 2004/003962 | 1/2004 |
| WO | WO-2007/106660 | 9/2007 |
| WO | WO-2007/121007 | 10/2007 |
| WO | WO-2007/131057 | 11/2007 |
| WO | WO-2008/089168 | 7/2008 |
| WO | WO-2008/130975 | 10/2008 |
| WO | WO-2009/014894 | 1/2009 |
| WO | WO-2009/102589 | 8/2009 |

OTHER PUBLICATIONS

Frederick. A. Lowenheim, Electroplating, McGraw-Hill Book Co., New York, 1978, pp. 452-453.*

Walter W. E. Hubner et al, The Practical Anodising of Aluminum, MacDonald & Evsns, London, 1960, pp. 1-3, 20-29.*

Elwin L. Rooy "Introduction to Aluminum and Aluminum Alloys", ASM Handbook, vol. 2, ASM International, 1990, pp. 3-14.*

F. A. Lowenheim, Electroplating, McGraw-Hill Book Co., New York, 1978, pp. 67-79.*

B. El-Kareh et al., "The Evolution of DRAM Cell Technology," May 1997, Solid State Technology, pp. 89-101.

Anthony C. Hart, "Alloy Plating Problem Cracked," Jun. 1998, Nickel Magazine.

Patent Abstracts of Japan, vol. 095, No. 002, Mar. 31, 2005 and JP 06 310065A, Nissin Electric Col Ltd., Nov. 4, 1994.

Patent Abstracts of Japan, vol. 1998, No. 08, Jun. 30, 1998 and JP 10 067554 (Kyocera Corp.), Mar. 10, 1998.

PCT International Search Report for International Application No. PCT/US99/16283, Mailed Nov. 25, 1999.

PCT International Search Report for International Application No. PCT/US02/41150, Mailed Jun. 2, 2003.

Lu et al., "Fabrication of Yttria-Stabilized Zirconia (YSZ) Film by Combined Operation of Electrophoretic Deposition and Electric Deposition," Chinese Journal of Materials . . . Research, Oct. 2001, vol. 15 No. 5, pp. 525-529.

Xie et al., "Fabrication of Yttria-Stabilized Zirconia (YSZ) Film by Electrochemical Deposition," May 2001, Journal of Chemical Industry and Engineering (China), vol. 52 . . . No. 5, pp. 451-455.

Office Action dated Jul. 9, 2003 in U.S. Appl. No. 10/042,666, "Process chamber having component with yttrium-aluminum coating".

Final Office Action dated Dec. 29, 2003 in U.S. Appl. No. 10/042,666, "Process chamber having component with yttrium-aluminum coating".

Office Action dated Feb. 28, 2006 in U.S. Appl. No. 10/824,123, "Process chamber component having electroplated yttrium containing coating".

Final Office Action dated Apr. 5, 2007 in U.S. Appl. No. 10/824,123, "Process chamber component having electroplated yttrium containing coating".

Office Action dated Sep. 7, 2007 in U.S. Appl. No. 10/824,123, "Process chamber component having electroplated yttrium containing coating".

Non-Final Office Action in U.S. Appl. No. 12/151,842 dated Jun. 10, 2010.

Office Action dated Sep. 1, 2009 in U.S. Appl. No. 12/151,842, "Process chamber component having electroplated yttrium containing coating".

Hawley's Condensed Chemical Dictionary, 14th Edition, John Wiley & Sons, Inc., New York, 2002, definition of "electroplating".

Office Action dated Dec. 29, 2009 in U.S. Appl. No. 11/766,723, "Forming a chamber component having a yttrium-containing coating".

Lowenheim, Frederick A., Electroplating, McGraw-Hill Book Co., New York, 1978, pp. 357-360.

Lowenheim, Frederick A., Modern Electroplating, John Wiley & Sons, Inc., New York, 1974, pp. 464-466.

Weast, Robert, editor, Handbook of Chemistry and Physics, 57th Edition, CRC Press, Cleveland, Ohio, 1976, pp. D-141 to D-146.

* cited by examiner

METHOD OF MANUFACTURING A PROCESS CHAMBER COMPONENT HAVING YTTRIUM-ALUMINUM COATING

CROSS-REFERENCE

This application is a divisional of U.S. Pat. No. 7,371,467, application Ser. No. 10/824,123, filed on Apr. 13, 2004, entitled "Process Chamber Component Having Electroplated Yttrium Containing Coating," which is a continuation-in-part of U.S. Pat. No. 6,942,929, application Ser. No. 10/042,666, entitled "Process Chamber Having Yttrium-Aluminum Coating," filed on Jan. 8, 2002, both of which are assigned to Applied Materials, Inc. and are herein incorporated by reference and in their entireties.

BACKGROUND

In the processing of substrates, for example, substrate etching processes, substrate deposition processes, and substrate and chamber cleaning processes, gases such as halogen or oxygen gases are used. The gases, especially when they are energized, for example by RF power or microwave energy, can corrode or erode (which terms are used interchangeably herein) components of the chamber, such as the chamber wall. For example, chamber components made of aluminum can be corroded by halogen gases to form $AlCl_3$ or $AlF_3$. The corroded components need to be replaced or cleaned off resulting in chamber downtime which is undesirable. Also, when the corroded portions of the components flake off and contaminate the substrate they reduce substrate yields. Thus, it is desirable to reducing corrosion of the chamber components.

The corrosion or erosion resistance of the aluminum chamber components may also be improved by forming an anodized aluminum oxide coating on the components. For example, an aluminum chamber wall may be anodized in an electroplating bath to form a protective coating of anodized aluminum oxide. The anodized coating increases the corrosion resistance of the aluminum chamber, but it still is sometimes degraded by highly energized or erosive gas compositions, for example, by an energized gas comprising a plasma of a fluorine containing gas, such as $CF_4$, to form gaseous byproducts such as $AlF_3$.

Conventional chamber components formed out of bulk ceramic materials or plasma sprayed ceramic coatings exhibit better erosion resistance but are susceptible to other failure modes. For example, chamber components formed out of a bulk material comprising a mixture of yttrium oxide and aluminum oxide, are brittle and tend to fracture when machined into a shape of a component. Bulk ceramic material may also be susceptible to cracking during operation of the chamber. Chamber components have also been made with plasma sprayed coatings. However, the thermal expansion mismatch between the coating and the underlying component material can cause thermal strains during heating or cooling that result in cracking or flaking off of the ceramic coating from the underlying component. Thus, conventional ceramic components do not always provide the desired corrosion and failure resistance.

Thus, there is a need for chamber components having improved corrosion or erosion resistance to corrosive energized gases. There is also a need to be able to easily manufacture such components into the desired shapes. There is a further need for durable chamber components that are not easily susceptible to cracking or breaking during operation of the chamber.

SUMMARY

A method of manufacturing a substrate processing chamber component comprises forming a chamber component comprising a metal alloy comprising yttrium and aluminum, and anodizing an exposed surface of the metal alloy.

Another method comprises forming a chamber component comprising a metal alloy comprising aluminum, ion implanting yttrium in the metal alloy, and anodizing a surface of the metal alloy.

Yet another method comprises forming a chamber component comprising a metal alloy comprising aluminum, ion implanting yttrium in the metal alloy, and ion implanting oxygen in the metal alloy.

A further method comprises forming a structure; and forming on the structure, a coating capable of being exposed to a plasma in the process chamber, the coating comprising yttrium-aluminum oxide having a compositional gradient through a thickness of the coating.

A substrate processing chamber component capable of being exposed to a RF or microwave energized gas in a substrate processing chamber, the component comprising a structure comprising (i) aluminum, or (ii) a metal alloy comprising yttrium and aluminum, the structure having an ion implanted surface coating comprising an yttrium-aluminum compound

DRAWINGS

These and other features, aspects, and advantages of the present invention will become better understood with regard to the following description, appended claims, and accompanying drawings which illustrate examples of the invention, where:

DESCRIPTION

Figure 1A:
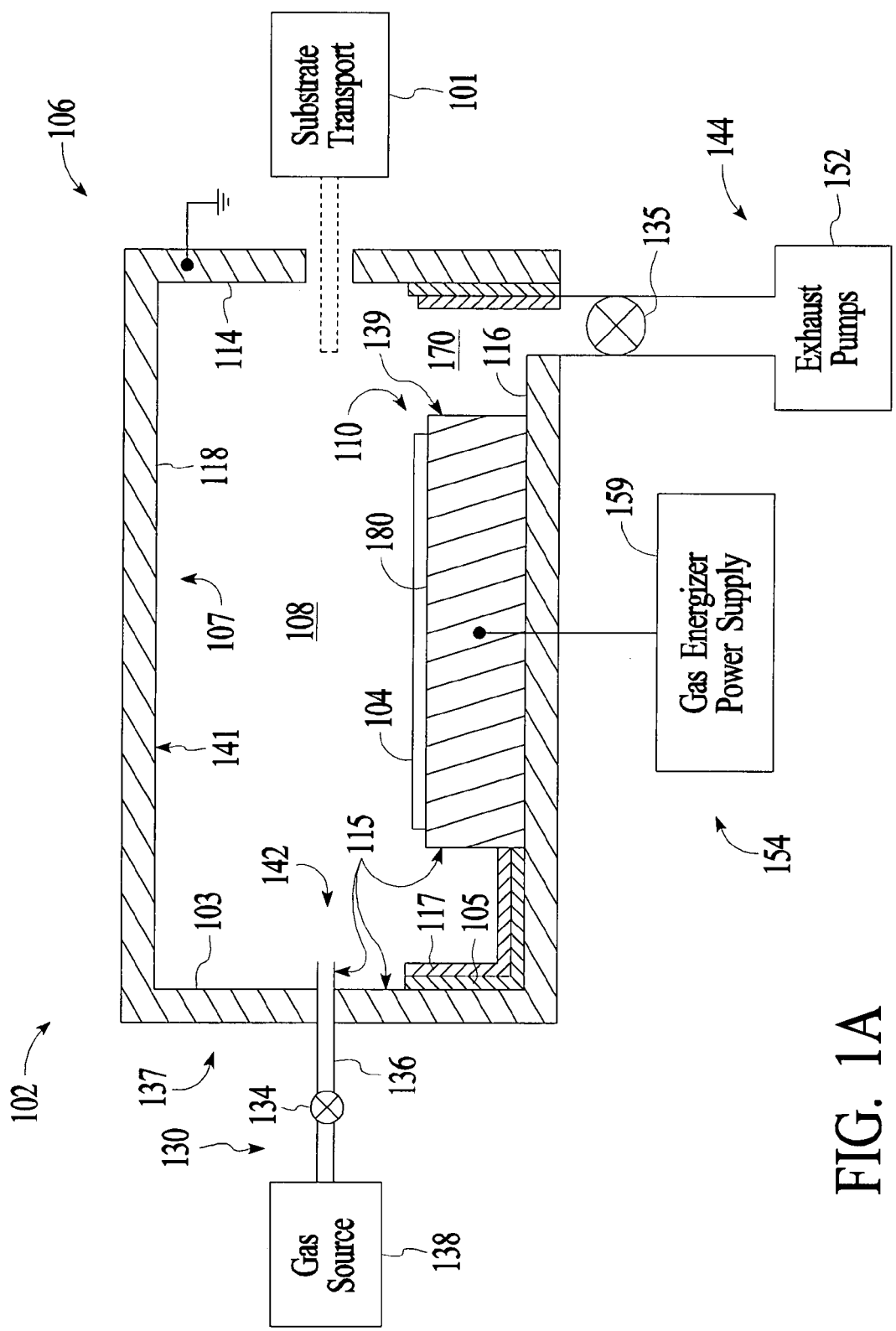
FIG. 1a is a schematic sectional side view of a version of an embodiment of a process chamber according to the present invention.
Figure 1B:
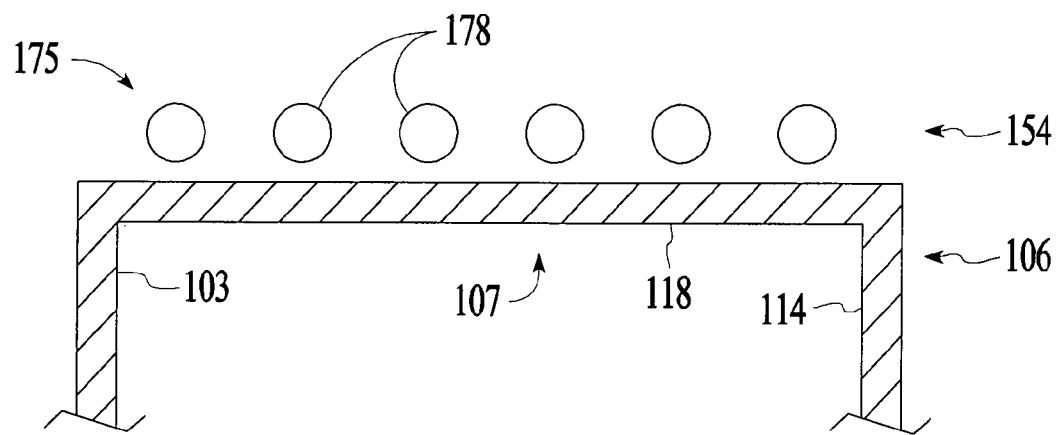
FIG. 1b is a sectional side view of another version of a gas energizer.
Figure 1C:
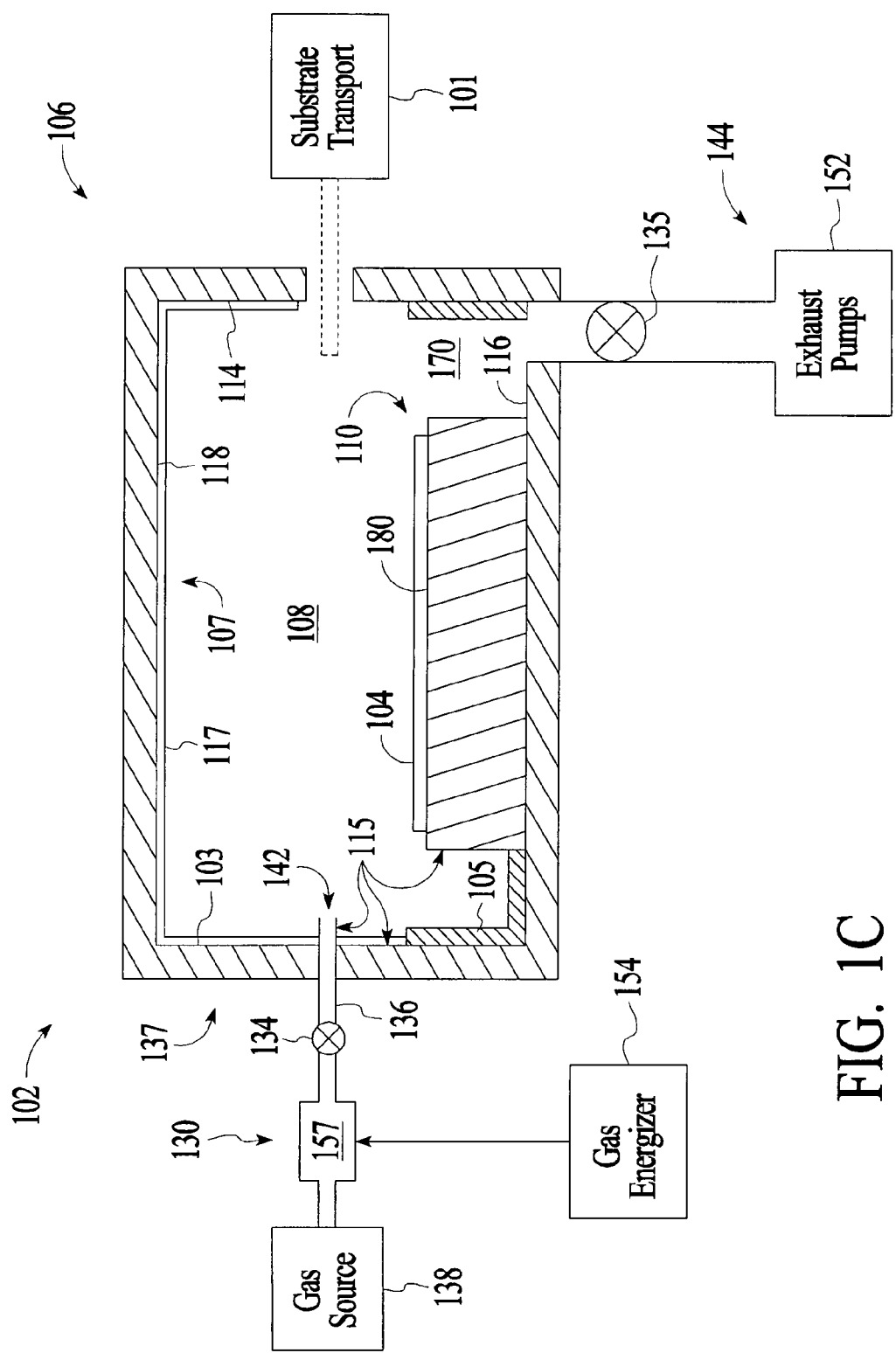
FIG. 1c is a schematic sectional side view of another version of the process chamber.

An exemplary apparatus 102 suitable for processing a substrate 104 comprises a process chamber 106 capable of enclosing a substrate 104, as shown in FIGS. 1a and 1c. The particular embodiment of the apparatus 102 shown herein is suitable for processing substrates 104 such as semiconductor wafers, and may be adapted by those of ordinary skill to process other substrates 104, such as flat panel displays, polymer panels, or other electrical circuit receiving structures. The apparatus 102 is particularly useful for processing layers, such as etch resistant, silicon-containing, metal-containing, dielectric, and/or conductor layers on the substrate 104. The apparatus 102 may be attached to a mainframe unit (not shown) that contains and provides electrical, plumbing, and other support functions for the apparatus 102 and may be part of a multichamber system (not shown). The multichamber system has the capability to transfer a substrate 104 between its chambers without breaking the vacuum and without exposing the substrate 104 to moisture or other contaminants outside the multichamber system. An advantage of the multichamber system is that different chambers in the multichamber system may be used for different purposes. For example, one chamber may be used for etching a substrate 104, another for the deposition of a metal film, another for rapid thermal processing, and yet another for depositing an anti-reflective layer. The process may proceed uninterrupted within the multichamber system, thereby preventing contamination of substrates 104 that may otherwise occur when transferring substrates 104 between various separate individual chambers for different parts of a process.

Generally, the process chamber 106 comprises a wall 107, such as an enclosure wall 103, which may comprise a ceiling 118, sidewalls 114, and a bottom wall 116 which enclose a process zone 108. The wall 107 may also comprise a chamber wall liner 105, which lines at least a portion of the enclosure wall 103 about the process zone 108. In operation, process gas is introduced into the chamber 106 through a gas supply 130 that includes a process gas source 138, and a gas distributor 137. The gas distributor 137 may comprise one or more conduits 136 having one or more gas flow valves 134, and one or more gas outlets 142 around a periphery of a substrate support 110 having a substrate receiving surface 180. Alternatively, the gas distributor 130 may comprise a showerhead gas distributor (not shown). Spent process gas and etchant byproducts are exhausted from the chamber 106 through an exhaust 144 which may include a pumping channel that receives spent process gas from the process zone, a throttle valve 135 to control the pressure of process gas in the chamber 106, and one or more exhaust pumps 152.

The process gas may be energized by a gas energizer 154 that couples energy to the process gas in the process zone 108 of the chamber 106. In the version shown in FIG. 1a, the gas energizer 154 comprises process electrodes 139, 141 that are powered by a power supply 159 to energize the process gas. The process electrodes 139, 141 may include an electrode 141 that is or is in a wall, such as a sidewall 114 or ceiling 118 of the chamber 106 that may be capacitively coupled to another electrode 139, such as an electrode in the support 110 below the substrate 104. Alternatively or additionally, as shown in FIG. 1b, the gas energizer 154 may comprise an antenna 175 comprising one or more inductor coils 178 which may have a circular symmetry about the center of the chamber 106. In yet another version, the gas energizer 154 may comprise a microwave source and waveguide to activate the process gas by microwave energy in a remote zone 157 upstream from the chamber 106, as shown in FIG. 1c. To process a substrate 104, the process chamber 106 is evacuated and maintained at a predetermined sub-atmospheric pressure. The substrate 104 is then provided on the support 110 by a substrate transport 101, such as for example a robot arm and a lift pin system. The gas energizer 154 then energizes a gas to provide an energized gas in the process zone 108 to process the substrate 104 by coupling RF or microwave energy to the gas.

Figure 2:
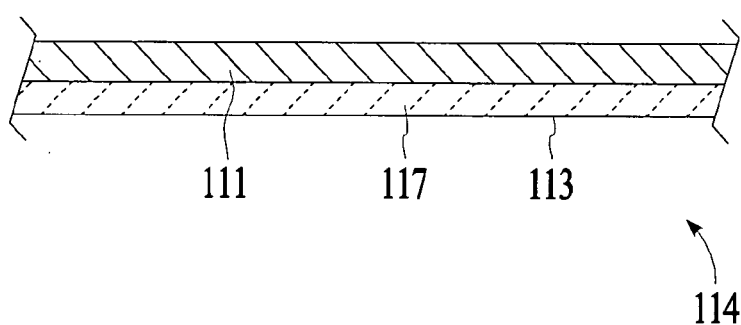
FIG. 2 is a partial sectional schematic side view of a chamber component comprising an integral surface coating of yttrium-aluminum compound.

At least one component 114 of the chamber 106 comprises an integral surface coating 117 comprising an yttrium-aluminum compound, as schematically illustrated in FIG. 2. The underlying structure 111 of the component 114 and the integral surface coating 117 form a unitary and continuous structure that is absent a discrete and sharp crystalline boundary therebetween. The integral surface coating is formed in-situ from the surface of the component 114 using at least a portion of the underlying component material. By "growing" the surface coating 117 out of the structure of which the component 114 is fabricated, the surface coating 117 is much more strongly bonded to the underlying component material structure than conventional coatings such as plasma sprayed coatings which have a discrete and sharp boundary between the coating and the underlying structure. The integral surface coating 117 is formed from the structure 111 by, for example, anodizing a component surface 112 comprising a desirable metallic composition or by ion implantation into the surface 112 of the component 114. The integral surface coating 117 may also have a compositional gradient that continuously or gradually varies in composition from an underlying material composition to a surface composition. As a result, the integral surface coating 117 is strongly bonded to the underlying material and this reduces flaking-off of the coating 117 and also allows the coating to better withstand thermal stresses without cracking.

The component 114 having the integral surface coating 117 may be the chamber wall 107, such as for example, a portion of an enclosure wall 103 or liner 105, the substrate support 110, the gas supply 130, the gas energizer 154, the gas exhaust 144, or the substrate transport 101. Portions of the chamber component 114 that are susceptible to corrosion or erosion, such as surfaces 115 of components 114 that are exposed to high temperatures, corrosive gases, and/or erosive sputtering species in the process zone 108, may also be processed to form the integral surface coating 117. For example, the component 114 may form a portion of the chamber wall 107, such as the chamber wall surface 115, that is exposed to the plasma in the chamber 106.

In one version, the integral surface coating 117 comprises an yttrium-aluminum compound which may be an alloy of yttrium and aluminum, or one or more compounds having a predefined stoichiometry, such as a plurality of oxides of yttrium and aluminum. For example, the yttrium-aluminum compound may be a mixture of $Y_2O_3$ and $Al_2O_3$, such as for example, yttrium aluminum garnet (YAG). When the integral surface coating 117 is an yttrium aluminum oxide, the coating 117 may have a concentration gradient of the oxide compounds through the thickness of the component 114, with a higher concentration of the oxide compounds typically being present closer to the surface 112 of the component 114 and the concentration of the oxide compounds decreasing with increasing distance into the interior structure 111 of the component and away from the surface 112.

For example, when the integral surface coating 117 comprises an yttrium aluminum oxide, the regions near the surface 112 tend to have a higher concentration of oxidized yttrium and aluminum species while regions towards the component interior 111 have a lower concentration of the oxidized species. The integral surface coating 117 of yttrium aluminum oxide exhibits good corrosion resistance from energized halogenated gases as well as good erosion resistance from energetic sputtering gases. In particular, the integral surface coating 117 exhibits good resistance to energized chlorine containing gases. The composition and thickness of the integral surface coating 117 is selected to enhance its resistance to corrosion and erosion, or other detrimental effects. For example, a thicker integral surface coating 117 may provide a more substantial barrier to corrosion or erosion of the chamber component 114, while a thinner coating is more suitable for thermal shock resistance. The integral surface coating 117 may even be formed such that the oxidized species, and thus the thickness of the coating 117, extends throughout the depth of the component or just on its surface. A suitable thickness of the integral surface coating 117 may be, for example, from about 0.5 mils to about 8 mils, or even from about 1 mil to about 4 mils.

In one version, the component 114 comprises a metal alloy comprising yttrium and aluminum and the integral surface coating 117 is formed by anodizing the surface of the metal alloy. The metal alloy having the anodized integral surface coating 117 may form a portion or all of the chamber component 114. The metal alloy comprises a composition of elemental yttrium and aluminum that is selected to provide desirable corrosion resistance or other alloy characteristics. For example, the composition may be selected to provide a metal alloy having good melting temperature or malleability to facilitate fabrication and shaping of the chamber components 114. The composition may also be selected to provide characteristics that are beneficial during the processing of substrates, such as resistance to corrosion in an energized process gas, resistance to high temperatures, or the ability to withstand thermal shock. In one version, a suitable composition comprises a metal alloy consisting essentially of yttrium and aluminum.

The composition of the metal alloy to be anodized is selected to provide the desired corrosion or erosion resistance properties for the overlying coating. The composition may be selected to provide a metal alloy capable of being anodized to form an anodized integral surface coating 117 that is resistant to corrosion by an energized gas. For example, the metal alloy composition may be selected to provide a desired coating composition of oxidized aluminum and yttrium on the surface 113 of the metal alloy when anodized in an acidic solution. A suitable composition of the metal alloy which provides a corrosion resistant anodized integral surface coating 117 is, for example, a metal alloy in which yttrium comprises at least about 5% by weight of the metal alloy, and preferably less than about 80% by weight of the metal alloy, for example, about 67% by weight of the metal alloy.

The metal alloy allows for an integrated or continuous structure with the overlying integral coating 117 that is advantageous. The integrated structure provides reduced thermal expansion mismatch problems between the anodized surface coating 117 and the underlying metal alloy. Instead, the anodized metal alloy comprising the anodized integral surface coating 117 remains a substantially unitary structure during heating and cooling of the metal alloy. Thus, the anodized integral surface coating 117 exhibits minimal cracking or flaking during substrate processing, and forms a durable corrosion resistant structure with the rest of the metal alloy.

In an exemplary method of fabricating the component 114 comprising the metal alloy comprising yttrium and aluminum and having the anodized integral surface coating 117, a mixture of yttrium and aluminum is heat softened or melted to form a metal alloy that is shaped to form a chamber component 113. The surface 113 of the chamber component 114 is cleaned and subsequently anodized by placing the chamber component 114 in an oxidizing solution and electrically biasing the chamber component 114.

Figure 3A:
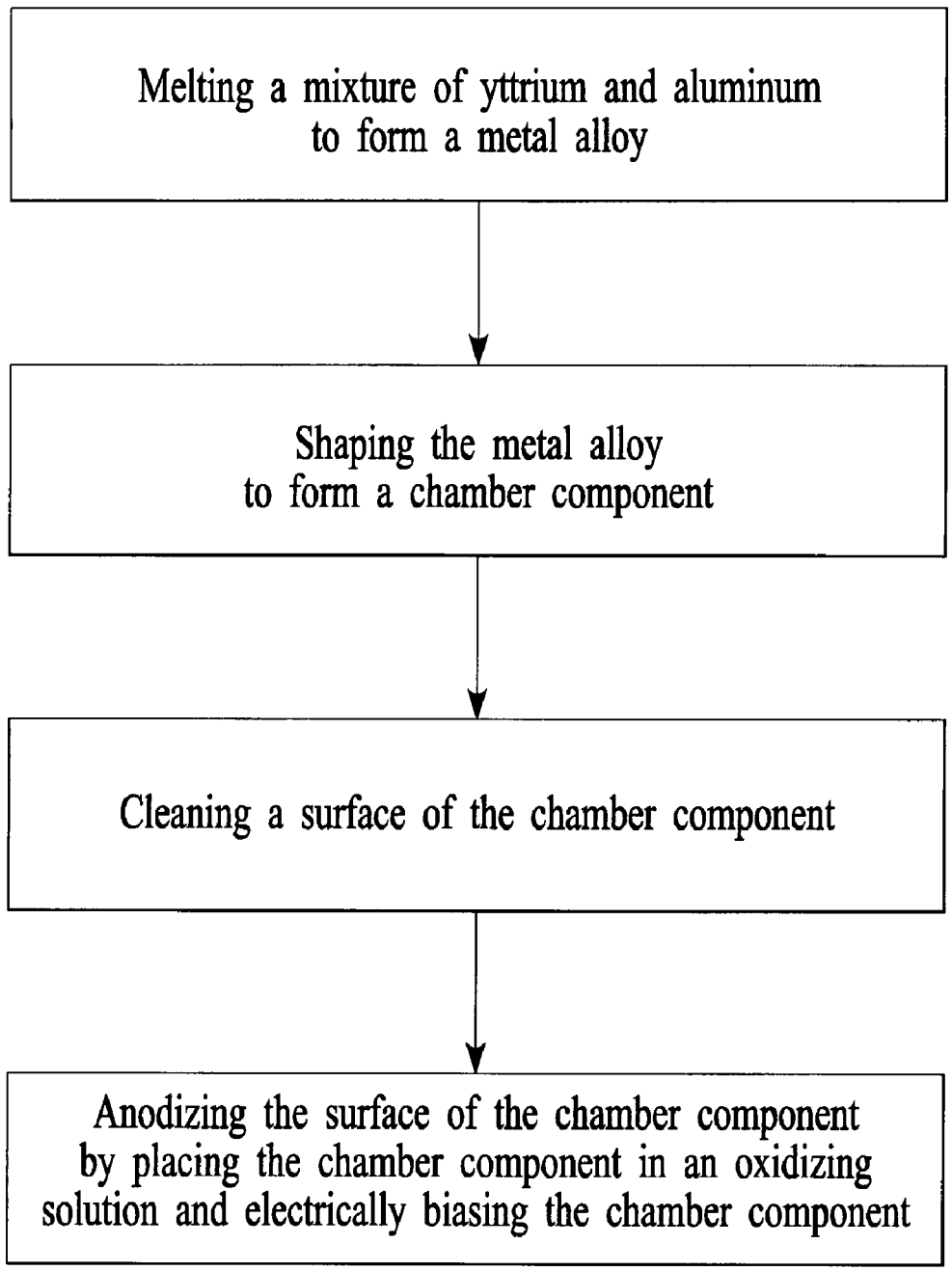
FIG. 3a is a flow chart of an embodiment of a process for anodizing a surface of a metal alloy component to form an integral surface coating.

FIG. 3a shows a flow chart illustrating an embodiment of an anodization method of manufacture. The metal alloy comprising yttrium and aluminum is formed in a desired composition. For example, a suitable composition may comprise a metal alloy in which the molar ratio of yttrium to aluminum is about 5:3. The metal alloy may be formed by, for example, heating a mixture comprising the desired amounts of yttrium and aluminum to a melting or softening temperature of the composition to melt the metals and combine them into a single alloy. While in one version, the metal alloy may consist essentially of yttrium and aluminum, other alloy agents, such as other metals, may be melted with the metallic yttrium and aluminum to aid in the formation of the metal alloy or to enhance the properties of the metal alloy. For example, cerium or other rare earth elements may be added.

The metal alloy is shaped to form the desired chamber component 114 or portion of the chamber component 114. For example, a desired shape of the metal alloy may be obtained by casting or machining the metal alloy. The metal alloy is cast by cooling molten or otherwise liquefied forms of the metal alloy in a casting container having a desired shape or form. The casting container may comprise the same container in which the metallic yttrium and aluminum are melted to form the alloy 112 or may be a separate casting container. Cooling of the heated metal alloy results in solidification of the metal alloy into a shape which conforms to the shape of the casting container, thus providing the desired metal alloy shape.

Once the metal alloy having the desired shape is formed, an anodization process may be performed to anodize a surface of the metal alloy, thereby forming the anodized integral surface coating 117 of oxidized species. The metal alloy may also be cleaned before anodization to remove any contaminants or particulates on the surface 113 of the metal alloy that might interfere with the growth of the anodized surface coating. For example, the surface 113 may be cleaned by immersing the metal alloy in an acidic solution to etch away contaminant particles or the metal alloy may be ultrasonically cleaned.

In one version, the metal alloy is anodized by electrolytically reacting the surface 113 of the metal alloy with an oxidizing agent. For example, the metal alloy may be placed in an oxidizing solution, such as an oxidizing acid solution, and electrically biased to induce formation of the anodized surface coating. Suitable acid solutions may comprise, for example, one or more of chromic acid, oxalic acid and sulfuric acid. The anodization process parameters, such as the acid solution composition, electrical bias power, and duration of the process may be selected to form an anodized integral surface coating 117 having the desired properties, such as for example a desired thickness or corrosion resistance. For example, a metal alloy comprising an anodized surface coating may be formed by anodizing the metal alloy in an acid solution comprising from about 0.5 M to about 1.5 M of sulfuric acid with a suitable applied bias power to the electrodes in the bath for a duration of from about 30 minutes to about 90 minutes, and even about 120 minutes.

The metal alloy may also be at least partially anodized by exposing the metal alloy to an oxygen containing gas, such as air. Oxygen from the air oxidizes the surface 113, thereby forming the anodized integral surface coating 117. The rate of the anodization process may be increased by heating the metal alloy and oxygen containing gas, and by using pure oxygen gas.

The steps of forming the chamber component 114 comprising the metal alloy 114 having the anodized integral surface coating 117 may be performed in the order which is most suitable for fabrication of the chamber component 114, as is known to those of ordinary skill in the art. For example, the anodization process may be performed after the metal alloy has been formed into a desired shape, as described above. As another example, the anodization process may be performed before the metal alloy 122 is formed into the desired shape. For example, the metal alloy may be shaped by welding before or after the anodization process.

The chamber components 114, such as the chamber wall 107, gas supply, gas energizer, gas exhaust, substrate transport, or support, which are at least partially formed from the metal alloy comprising yttrium and aluminum and having the anodized integral surface coating 117, provide improved resistance to corrosion of the component 114 by an energized process gas and at high processing temperatures. The integrated structure of the metal alloy having the anodized integral surface coating 117 further enhances corrosion resistance, and reduces cracking or flaking of the anodized surface coating. Thus, desirably the chamber components 114 comprise the metal alloy having the anodized integral surface coating 117 at regions of the components 114 that are susceptible to corrosion, such as surfaces 115 of the chamber wall 107 that are exposed to the process zone, to reduce the corrosion and erosion of these regions.

Figure 3B:
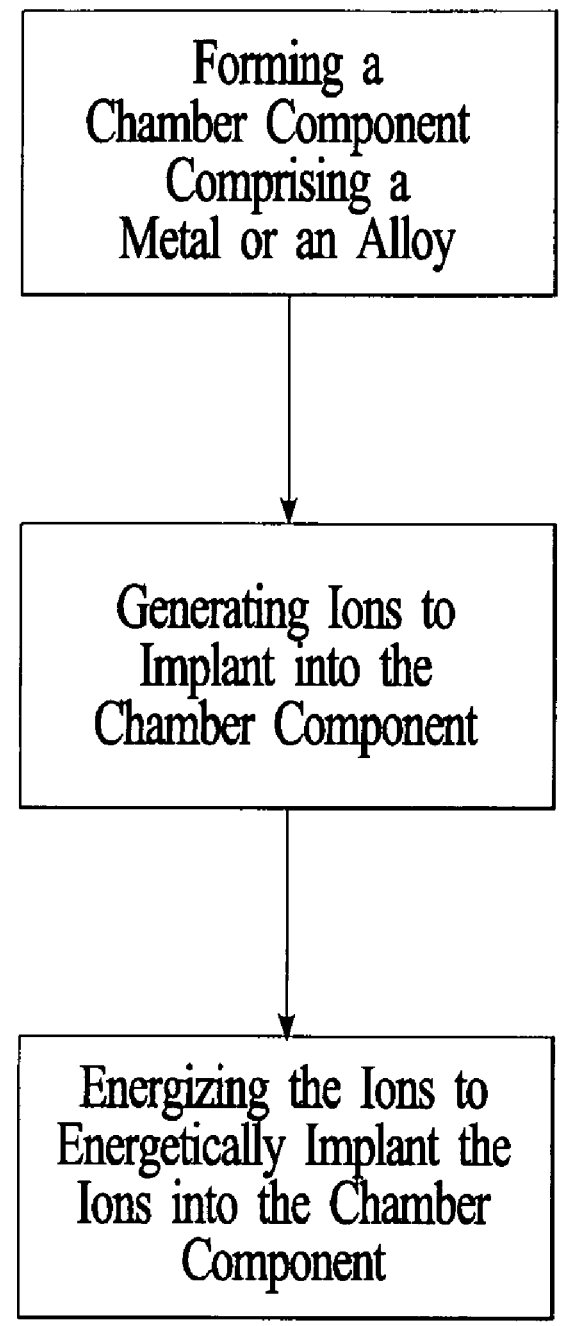
FIG. 3b is a flow chart of an embodiment of a process for ion implanting a surface of a component to form an integral surface coating.
Figure 4:
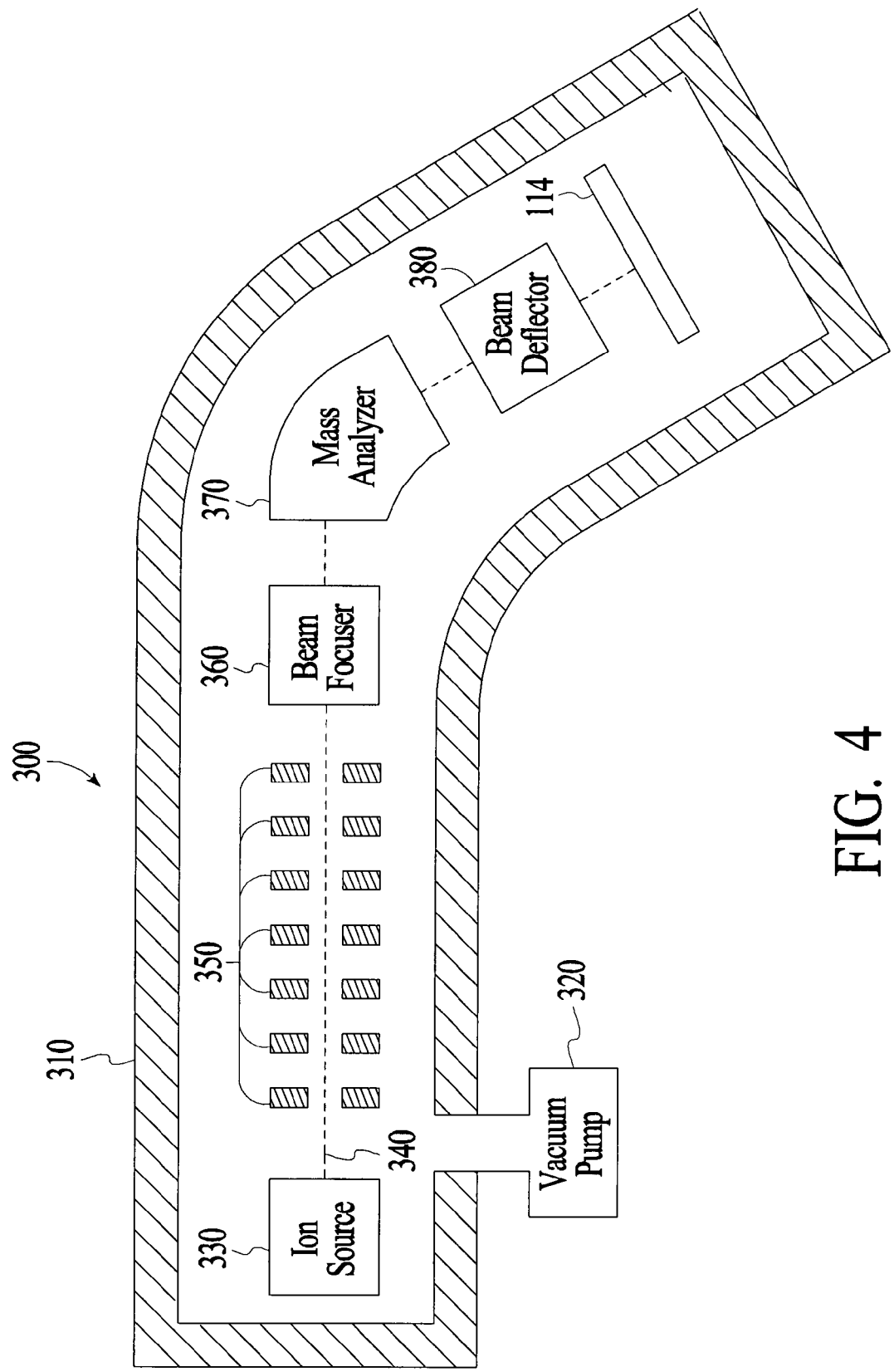
FIG. 4 is a schematic top view of an ion implanter.

In another aspect of the present invention, an ion implanter 300, as illustrated in FIG. 4, forms the integral surface coating 117 by ion implanting a constituent material of the integral surface coating 117 into the surface 112 of the component 114. In this method, the ion implanter 300 fabricates the component 114, for example, from one or more metals, and implants other metal or non-metal species into the component 114 by bombarding its surface 112 with energetic ion implantation species. In one embodiment, energetic yttrium ions are implanted into the surface 112 of a component 114 comprising aluminum, while in another embodiment energetic oxygen ions are implanted into the surface 112 of an yttrium-aluminum alloy. The ion implanter 300 comprises a vacuum housing 310 to enclose a vacuum environment, and one or more vacuum pumps 320 to evacuate the vacuum housing 310 to create the vacuum environment therein. The ion implantation process may be carried out at room temperature or at higher temperatures. A listing of the typical process steps is provided in FIG. 3b.

An ion implanter 300 provides good control of the uniformity and surface distribution of the material implanted into the surface 112 of the metal alloy. For example, the ion implanter 300 can control the implantation density with which the implantable ions are implanted in the component 114 and a penetration depth of the implanting material in the component 114. The ion implanter 300 can also provide uniform surface coverage and concentration levels. Additionally, the ion implanter 300 can also form the integral surface coating 117 on only certain selected regions of the component 114, and the distribution of the implanting material at the edges of the regions may be controlled. In typical ion implantation methods, a good range of ion doses may be implanted, such as for example, from about $10^{11}$ to about $10^{17}$ ions/cm$^2$. In one embodiment, the ion implanter 300 can control the dose to within ±1% within this dose range.

Typically, the ion implanter 300 comprises an ion source 330 in the vacuum housing 310 to provide and ionize the material to be implanted to form the integral surface coating 117. In one version, the ion source 330 contains the implanting material in a solid form and a vaporization chamber (not shown) is used to vaporize the solid implanting material. In another version, the ion source 330 provides the implanting material in a gaseous form. For example, gaseous implanting material may be fed into the ion source 330 from a remote location, thereby allowing the material to be replenished in the ion source 330 without opening the vacuum housing 310 or otherwise disrupting the vacuum environment. The implanting material may comprise, for example, elemental yttrium or oxygen which is to be implanted in an aluminum component to form a component comprising an yttrium-aluminum oxide compound, such as YAG. Any source of the ionizable material may be used, such as for example, a gas comprising yttrium, solid yttrium, or oxygen gas.

Figure 5:
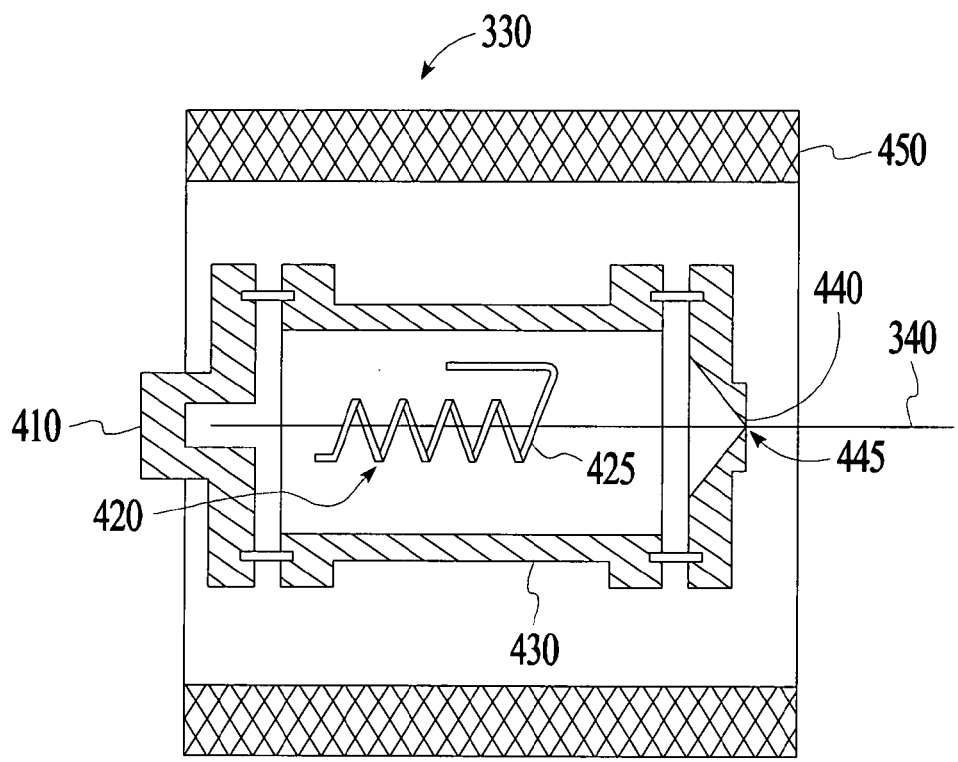
FIG. 5 is a schematic sectional side view of an ion source in the ion implanter of FIG. 4.

In one embodiment, illustrated in FIG. 5, the ion source 330 comprises a gas inlet 410 through which the gaseous implanting material is introduced into an ionization zone of an ionization system 420 to ionize the gaseous implanting material prior to its delivery to the component surface 112. The gaseous or vaporized implanting material is ionized by passing the gas or vapor through a hot cathode electronic discharge, a cold cathode electronic discharge, or an R.F. discharge. In one version, the ionization system 420 comprises a heated filament 425. The ion source 330 further comprises an anode 430 and an extraction electrode 440 that is about an extraction outlet 445, which are incrementally electrically biased to extract the positive ions from the ionized gas and form an ion beam 340. In one embodiment, the anode 430 is biased at from about 70 V to about 130 V, such as at about 100 V. The extraction electrode 440 may be biased at from about 10 keV to about 25 keV, such as from about 15 keV to about 20 keV. The extraction outlet 445 may be shaped to define the shape of the ion beam 340. For example, the extraction outlet 445 may be a circular hole or a rectangular slit. A solenoid 450 is provided to generate a magnetic field that forces the electrons to move in a spiral trajectory, to increase the ionizing efficiency of the ion source 330. An exemplary suitable range of current of the ion beam 340 is from about 0.1 mA to about 100 mA, such as from about 1 mA to about 20 mA.

Returning to FIG. 4, the ion implanter 300 also typically comprises a series of accelerator electrodes 350 to accelerate the ion beam 340. The accelerator electrodes 350 are generally maintained at incrementally increasing levels of electric potential along the propagation direction of the ion beam 340 to gradually accelerate the ion beam 340. In one version, the accelerator electrodes 350 accelerate the ion beam 340 to energies of from about 50 to about 500 keV, and more typically from about 100 to about 400 keV. The higher energy ion beams may be used to implant ions that are relatively heavy or are desirably implanted deep into the surface 112 of the component 114.

The ion implanter 300 comprises a beam focuser 360 to focus the ion beam 340. In one version, the beam focuser 360 comprises a magnetic field lens (not shown) that generates a magnetic field to converge the ion beam 340. For example, the magnetic field may be approximately parallel to the propagation direction of the ion beam 340. The beam focuser 360 may additionally serve to further accelerate the ion beam 340, such as by being maintained at an electric potential. In another version, the beam focuser 360 comprises an electrostatic field lens (not shown) that generates an electric field to converge the ion beam 340. For example, a portion of the electric field may be approximately orthogonal to the propagation direction of the ion beam 340.

In one version, the ion implanter 300 further comprises a mass analyzer 370 to analyze or select the mass of the ions. In one version, the mass analyzer 370 comprises a curved channel (not shown) through which the ion beam 340 may pass. The mass analyzer 370 generates a magnetic field inside the channel to accelerate ions having a selected ratio of mass to charge along the inside of the curved channel. Ions that have substantially different ratios of mass to charge from the selected ions collide with the sides of the curved channel and thus do not continue to pass through the curved channel. In one embodiment, by selecting a particular magnetic field strength, the mass analyzer 370 selects a particular ratio of mass to charge to allow. In another embodiment, the mass analyzer 370 determines the mass to charge ratio distribution of the ion beam 340 by testing a range of magnetic field strengths and detecting the number of ions passing through the curved channel at each magnetic field strength. The mass analyzer 370 typically comprises a plurality of magnet pole pieces made of a ferromagnetic material. One or more solenoids may be provided to generate magnetic fields in the vicinity of the magnet pole pieces.

The ion implanter 300 comprises a beam deflector 380 to deflect the ion beam 340 across the surface 112 of the component 114 to distributively implant ions into the component 114. In one embodiment, the beam deflector 380 comprises an electrostatic deflector that generates an electric field to deflect the ion beam 340. The electric field has a field component orthogonal to the propagation direction of the ion beam 340 along which the electrostatic deflector deflects the ion beam 340. In another embodiment, the beam deflector 380 comprises a magnetic deflector that generates a magnetic field to deflect the ion beam. The magnetic field has a field component orthogonal to the propagation direction of the ion beam 340, and the magnetic deflector deflects the ion beam 340 in a direction that is orthogonal to both the propagation direction of the ion beam 340 and its orthogonal magnetic field component.

The ion implanter 300 implants an amount of implanting material into the structure 111 of the component 114 such that the ratio of the implanted material to the material of the underlying structure provides the desired stoichiometry. For example, when implanting yttrium ions into the surface of an aluminum structure, it may be desirable to have a molar ratio of aluminum to yttrium of from about 4:2 to about 6:4, or even about 5:3. This ratio is optimized to provide YAG when the structure 111 is subsequently annealed, anodized, or implanted with oxygen ions.

Figure 6:
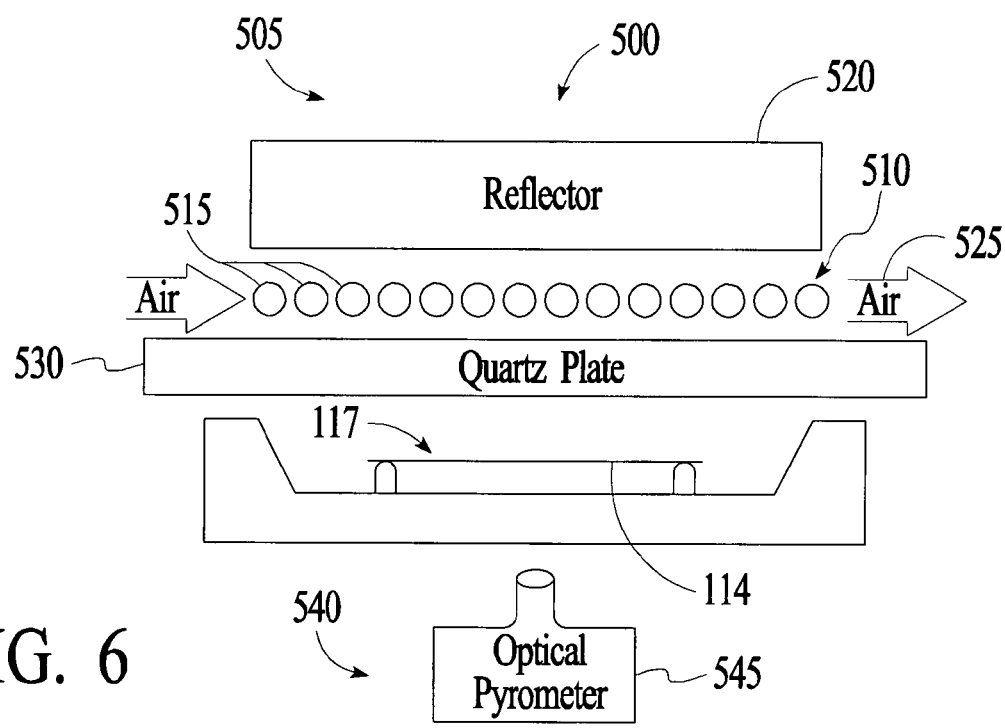
FIG. 6 is a schematic sectional side view of an annealer.

An annealer 500, as illustrated in FIG. 6, may also be used to anneal the component 114 to restore any damage to the crystalline structure of the component 114. For example, the annealer 500 may "heal" regions of the component 114 that were damaged during ion implantation by the energetic ions. Typically, the annealer 400 comprises a heat source 510, such as an incoherent or coherent electromagnetic radiation source, that is capable of heating the component 114 to a suitable temperature for annealing. For example, the annealer 400 may heat the component 114 to a temperature of at least about 600° C., such as for example, at least about 900° C. In the embodiment shown in in FIG. 6, the annealer 400 is a rapid thermal annealer 505 comprising a heat source 510 that includes tungsten halogen lamps 515 to generate radiation and a reflector 520 to reflect the radiation onto the component 114. A fluid 525, such as air or water is flowed along the heat source 510 to regulate the temperature of the heat source 510. In one version, a quartz plate 530 is provided between the heat source 510 and the component 114 to separate the fluid from the component 114. The rapid thermal annealer 505 may further comprise a temperature monitor 540 to monitor the temperature of the component 114. In one embodiment, the temperature monitor 540 comprises an optical pyrometer 545 that analyzes radiation emitted by the component 114 to determine a temperature of the component 114.

Although exemplary embodiments of the present invention are shown and described, those of ordinary skill in the art may devise other embodiments which incorporate the present invention, and which are also within the scope of the present invention. For example, the metal alloy may comprise other suitable components, such as other metals without deviating from the scope of the present invention. Also, the metal alloy may form portions of chamber components 114 other than those specifically mentioned, as would be apparent to those of ordinary skill in the art. Furthermore, the terms below, above, bottom, top, up, down, first and second and other relative or positional terms are shown with respect to the exemplary embodiments in the figures and are interchangeable. Therefore, the appended claims should not be limited to the descriptions of the preferred versions, materials, or spatial arrangements described herein to illustrate the invention.

What is claimed is:

1. A method of manufacturing a substrate processing chamber component, the method comprising:
    (a) forming a chamber component comprising a structure comprising a metal alloy composed of yttrium and aluminum; and
    (b) anodizing a surface of the metal alloy structure by applying an electrical bias to the structure in an acidic solution to form an anodized coating of yttrium aluminum garnet.

2. A method according to claim 1 comprising forming a structure comprising a metal alloy having an yttrium content of less than about 50% by weight.

3. A method according to claim 1 comprising anodizing the surface of the metal alloy of the structure to form an anodized coating having a thickness of from about 0.5 mils to about 8 mils.

4. A method according to claim 1 comprising anodizing the surface of the metal alloy of the structure in an acidic solution comprising one or more of oxalic acid, chromic acid and sulfuric acid.

5. A method according to claim 1 comprising anodizing the surface of the metal alloy of the structure for from about 30 minutes to about 120 minutes.

6. A method according to claim 1 comprising anodizing the surface of the metal alloy of the structure to form an anodized coating of yttrium aluminum garnet having a compositional gradient through a thickness of the anodized coating.

7. A method according to claim 1 wherein the molar ratio of yttrium to aluminum in the metal alloy is 3:5.

8. A method according to claim 1 comprising forming the structure of the chamber component by at least one of: casting and machining.

9. A method according to claim 1 comprising anodizing the surface of the metal alloy of the structure in an acid solution comprising from about 0.5 M to about 1.5 M of sulfuric acid.

10. A method according to claim 1 comprising, before (b), cleaning the surface of the metal alloy of the structure by at least one of: immersing the metal alloy in acidic solution and ultrasonically cleaning.

11. A method of manufacturing a plasma process chamber component, the method comprising:
    (a) forming a structure comprising a metal alloy composed of yttrium and aluminum; and
    (b) anodizing a surface of the structure by applying an electrical bias to the structure in an acidic solution while controlling the anodizing process parameters to form on the structure, a coating comprising yttrium aluminum garnet having a compositional gradient through a thickness of the coating.

12. A method according to claim 11 comprising anodizing the surface of the metal alloy of the structure in an acidic solution comprising one or more of oxalic acid, chromic acid and sulfuric acid.

13. A method according to claim 11 comprising anodizing the surface of the metal alloy of the structure in an acidic solution comprising from about 0.5 M to about 1.5 M of sulfuric acid.

14. A method according to claim 11 wherein the molar ratio of yttrium to aluminum in the metal alloy is 3:5.

15. A method according to claim 11 comprising forming the chamber component by at least one of: casting and machining.

16. A method according to claim 11 comprising, before (b), cleaning the surface of the metal alloy of the structure by at least one of: immersing the metal alloy in acidic solution and ultrasonically cleaning.

17. A method of manufacturing a plasma process chamber component, the method comprising:
(a) anodizing a surface of a metal alloy composed of aluminum and yttrium by applying an electrical bias to the structure in an acidic solution to form, on the metal alloy, an anodized coating of yttrium aluminum garnet; and
(b) shaping the anodized metal alloy into a structure capable of use as a plasma process chamber component.

18. A method according to claim 17 comprising anodizing the surface of the metal alloy in an acidic solution comprising one or more of oxalic acid, chromic acid and sulfuric acid.

19. A method according to claim 17 comprising anodizing the metal alloy in an acidic solution comprising from about 0.5 M to about 1.5 M of sulfuric acid.

20. A method according to claim 17 wherein the molar ratio of yttrium to aluminum in the metal alloy is 3:5.

21. A method according to claim 17 comprising forming the chamber component by at least one of: casting and machining.

22. A method according to claim 17 comprising, before (a), cleaning the surface of the metal alloy by at least one of: immersing the metal alloy in acidic solution and ultrasonically cleaning.

23. A method according to claim 17 wherein (b) comprises shaping the anodized metal alloy by welding.

* * * * *